United States Patent
Guo (10) Patent No.: US 8,497,738 B2
(45) Date of Patent: Jul. 30, 2013

(54) BROADBAND POWER COMBINING METHOD AND HIGH POWER AMPLIFIER USING SAME

(76) Inventor: Yaohui Guo, Lexington, MA (US)

( * ) Notice: Subject to any disclaimer, the term of this patent is extended or adjusted under 35 U.S.C. 154(b) by 0 days.

(21) Appl. No.: 13/205,727

(22) Filed: Aug. 9, 2011

(65) Prior Publication Data

US 2012/0038424 A1 Feb. 16, 2012

Related U.S. Application Data

(60) Provisional application No. 61/372,551, filed on Aug. 11, 2010.

(51) Int. Cl.
*H03F 3/68* (2006.01)
(52) U.S. Cl.
USPC ........................................ 330/295; 330/124 R
(58) Field of Classification Search
USPC .................... 330/295, 124 R, 286, 84, 53
See application file for complete search history.

(56) References Cited

U.S. PATENT DOCUMENTS 7,482,874 B2 * 1/2009 Heydari et al. ............... 330/286

* cited by examiner

*Primary Examiner* — Hieu Nguyen (57) ABSTRACT

A broadband power combining method comprises the steps of converting desired voltage or current relation over a specified frequency band to specified polynomial transfer equation; steps of formulating the said specified polynomial transfer equation and extracting the coefficients of the denominator polynomial functions; steps of comparing the said voltage/current transfer function in first step with the design goal to decide if the design criteria is met; and a multiple-device power combining amplifier using same method is presented. This invention presents an automated method for the designing high power multiple-device amplifier based on a compact, robust and easily extendable combining circuit-synthesis method. By using multiple low-power transistors and the proposed circuit synthesis method, this broadband power combining amplifier can provide high power level with 100% power combining efficiency over any given wide bandwidth, thereby allowing for high-speed communication with less power consumption at lower cost when used in cellular or satellite transceiver systems.

5 Claims, 11 Drawing Sheets

Power Combining network principle

$N(i) = \begin{bmatrix} A & B \\ C & D \end{bmatrix}$ $g_2(f)+jb_2(f)$ →
$V_2$
$I_2$ →

52

$$\frac{V_1}{V_2} = A + B(g_2 + jb_2) = re^{j\theta} \quad (1)$$

(a) Waveform at 4GHz
(b) Waveform at 7GHz
(c) Waveform at 10 GHz

Fig. 9

BROADBAND POWER COMBINING METHOD AND HIGH POWER AMPLIFIER USING SAME

RELATED APPLICATIONS

This application claims the benefit of priority under 35 U.S.C. §119(e) of U.S. Provisional Patent Application No. 61/372,551, filed Aug. 11, 2010, and entitled "A BROADBAND POWER COMBINING METHOD AND HIGH POWER AMPLIFIER USING SAME", the disclosure of which is hereby incorporated by reference in its entirety.

BACKGROUND

1. Field of Invention

This invention relates to a broadband power combining method and power dividing and combining amplifier designed using such a circuit synthesis method.

2. Discussion of Related Art

High efficiency high power amplifiers have been widely employed in many radio frequency (RF), microwave and millimeter frequency applications. There have been many approaches and topologies proposed in previous works on the designs of multi-device power combining amplifier to meet various application demands. There have been several publications: Dupulis, "Stacked RF Power Amplifier", U.S. Pat. No. 2006/0226905 A1, which described a stacked approach using two devices for RF power amplifier; Ky-Hien Do, "Wide Bandwidth, High Power Amplifier", which proposed a combining topology for high power amplifier using multiple transformers that are connected in series (stacked) to increase the output voltage swing.

Many forms of power dividing and combining amplifiers are also known in the art. See: Takagi et al, "Microwave Power Combining FET Amplifier", U.S. Pat. No. 4,803,443; Cripe, "Combining Circuit for Class-E RF Power Amplifiers", U.S. Pat. No. 5,247,264; Stedman et al, "Power Combiner for Use In A Radio Frequency System and A Method of Constructing A Power Combiner", U.S. Pat. No. 5,543,751; Tajima et al, "Amplifier Having Substantially Constant DC. To RF Conversion Efficiency", U.S. Pat. No. 5,025,225; P. Haldi et al, "A 5.8 GHz Linear Power Amplifier in a Standard 90 nm CMOS Process using a 1V Power Supply", 2007 IEEE Radio Frequency Integrated Circuits Symposium, pp. 431-434, as well as S. Kim et al, "An Optimized Design of Distributed Active Transformer", IEEE Transactions on Microwave Theory and Techniques, Vol. 53, No. 1 Jan., 2005, pp. 380-388. All these references are incorporated by reference herein. However, none of existing solutions provide generalized solutions addressing the fundamental power combining problem: how to divide and combine voltage/current among multiple active devices to achieve specified power dividing/combining ratio over any given frequency bandwidth. Current design approaches either can only provide single solution for a given device structure within a very limited bandwidth, or can provide wide band responses at large cost of degraded power combining efficiency.

SUMMARY OF INVENTION

In accordance with various aspects of the invention in at least one embodiment the invention presents an automated method for the designing high power multiple-device amplifier based on a compact, robust and easily extendable combining circuit-synthesis method invention presented here. By using multiple low-power transistors and the proposed circuit synthesis method, this broadband power combining amplifier can provide high power level with theoretically 100% power combining efficiency over any given wide bandwidth, thereby allowing for high-speed communication with less power consumption at lower cost when used in cellular or satellite transceiver systems. Moreover, based on the circuit-synthesis method in this invention, the amplifier's compact real-estate is at least 50% smaller than the ones designed through conventional approaches, which can greatly bring down the fabrication cost. Finally, with the growing demands in the satellite and 3G/4G cellular communications, considerably increased user and speed capacity at lower cost can be achieved through using multiple-device power amplifier that can efficiently deliver power from low-power process using compact circuits.

The present invention resides in a power combining method that can be realized in most commercially available programming language, and is particularly useful for but not limited to the design of Radio Frequency (RF), microwave and millimeter-wave integrated circuit network that requires specified voltage/current transferring function over a given frequency range, like the dividing/combining circuits in power amplifier where equal amplitude voltage/current transferring function over a given frequency range are needed to achieve 100% power combining efficiency. Another application of proposed power combining method is in the phase array network, where specified amplitude and phase relations and transferring function of the circuit network between antennas are needed to form desired radiation patterns (i.e. Radar beam forming and steering).

Briefly, and in general terms, the invention comprises the steps of defining and constructing the desired voltage or current transfer functions between the complex admittance or impedance of the active devices, selecting proper dividing/combining network topologies among low-pass, band-pass and high-pass as initial guess or starting point, and then converting the initial network to polymonial expression in frequency domain, where the polynomial coefficients are exclusively corresponding to the roots of the voltage/current transfer functions. Once the voltage or current transfer functions are formed for given complex admittance/impedance, then the coefficients are ready for any optimization/solution-search engine to optimize the transfer polynomial function to provide the design voltage/current dividing and combining among active devices. Finally, the optimized transfer polynomial function is converted to the corresponding passive network, which is the final solution to provide the desired performance for power dividing and combing or phase transferring circuits.

The invention results from the realization, in part, that an improved power dividing/combining amplifiers, in various aspects can be achieved with multiple active transistors interconnected via the designed voltage/current transferring networks at the device input terminal and output terminal. Designed based on the method in invention, those multiple active devices will receive equal amount of input power and contribute equal amounts of output power, thereby, achieve the maximum utilization of each device and 100% power combining efficiency.

The subject invention, however, in other embodiments, need not achieve all these objectives and the claims hereof should not be limited to structures or methods capable of achieving these objectives.

This invention features a power combining method which includes converting the desired power dividing/combining relation among active devices to specified voltage or current transfer function, and then converting the specified transfer function to polynomial expression over the frequency domain, which in turn is solved and optimized to deliver the circuit solution for the power dividing and combining networks for given sets of multiple active devices over specified frequency bands.

In a preferred embodiment the power combining amplifier designed based on the method in this invention may have two or higher devices that may or may not be identical. In a preferred embodiment where active devices are identical in size, bias and power capability, the equal power dividing and combining may be achieved via equal voltage dividing at the input of the devices and combining at the output of the devices, or may be achieved via equal current dividing at the input of the devices and combining at the output of the devices, or may be achieve via equal voltage dividing at the input of the devices and equal current combining at the output of the devices, or may be achieved via equal current dividing at the input of the devices and equal current combining at the output of the devices.

Different combinations of current and voltage dividing and combining at the input and output are possible according to application requirements. Although this invention can provide circuit synthesis solution for all of above combinations, for most RF and microwave frequency high power amplifiers, the current dividing at the input and voltage combining at the output provides the optimal solution that are easily to implement because of the high impedances at the input of the active device and low impedance at the output of the active device. The circuit network solution coming out of the proposed method are composed of ideal lumped elements such as inductors, capacitors and transformers but can be easily converted and realized in practical circuit network consisting of inductor, capacitor and distributed transmission line networks. In a preferred embodiment there may be a different optimization or design goal other than $V_1/V_2$ at certain desired relation. The design goal could be $I_1/I_2$ at specified magnitude and phase relation. This invention features both current splitting/combining (with $V_1/V_2$ relation as optimization goals) and voltage splitting/combining (with $I_1/I_2$ optimization goals)

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This invention relates to a power combining method that provide applicable circuit solutions and layouts for designs that requires pre-specified voltage or current transfer relation over a given frequency band. This power combining method can be applied to particularly but not exclusively to multiple device power amplifier or phase array circuits for use in radio frequency (RF) and microwave frequency communication and radar systems and the like.

Figure 1:
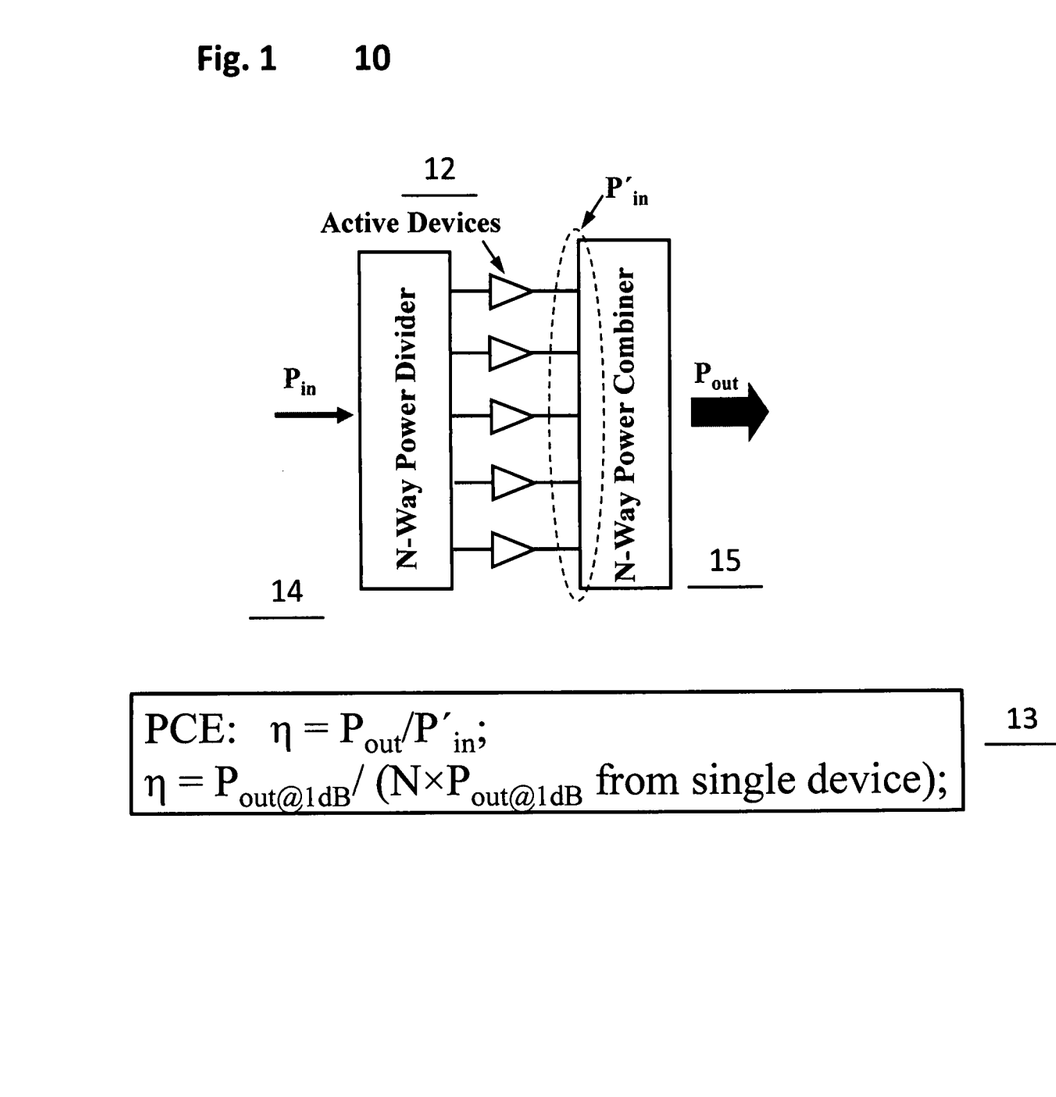
FIG. 1 is a simplified block diagram showing the general purpose multi-chip power dividing and combining amplifier with equations specified the performance criteria for power combining efficiency, which is one of key performance factors evaluating the effectiveness of the combining circuits.
Figure 1A:
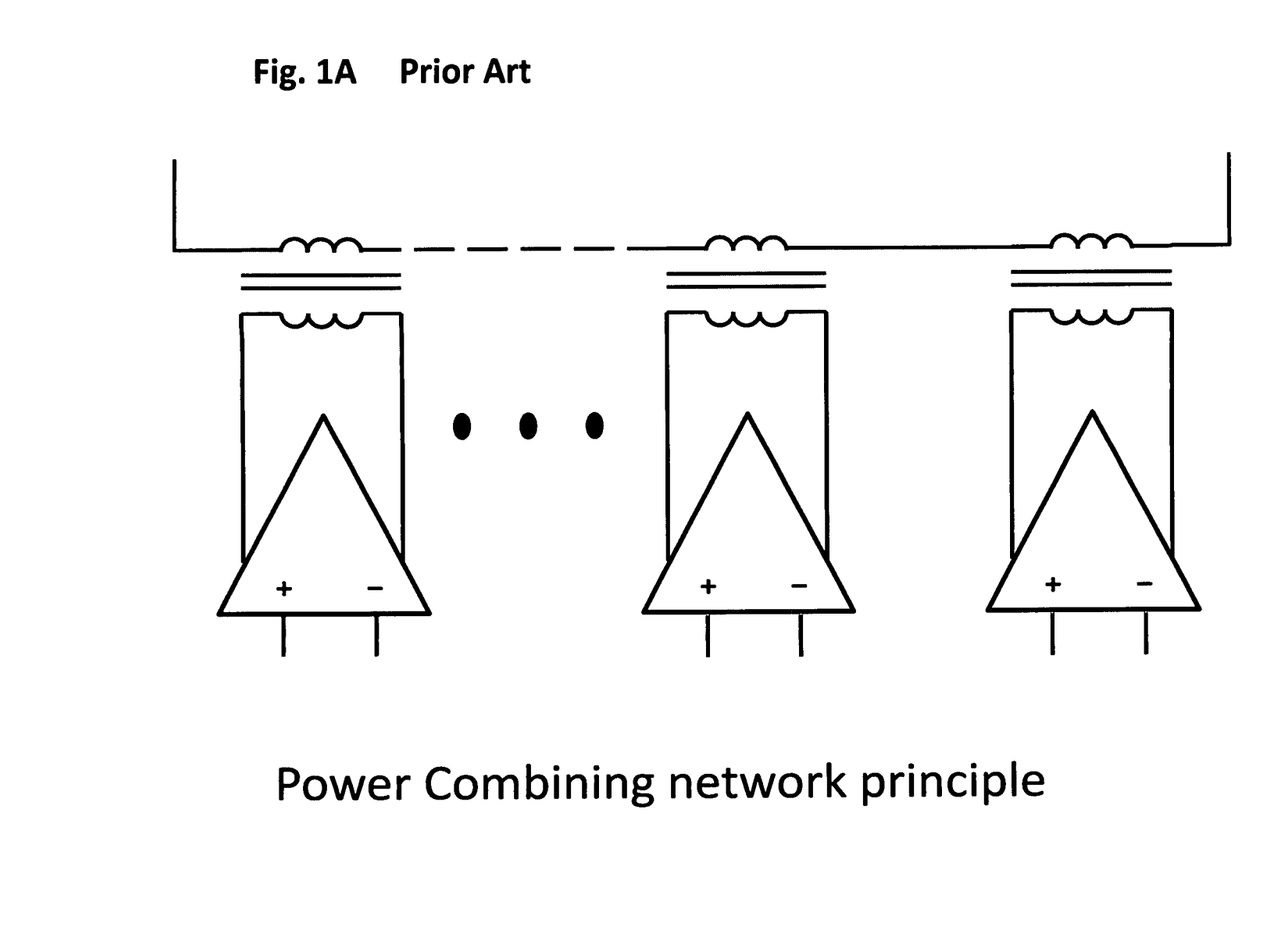
FIG. 1A is illustration of a prior art using transformer for power combining.
Figure 1B:
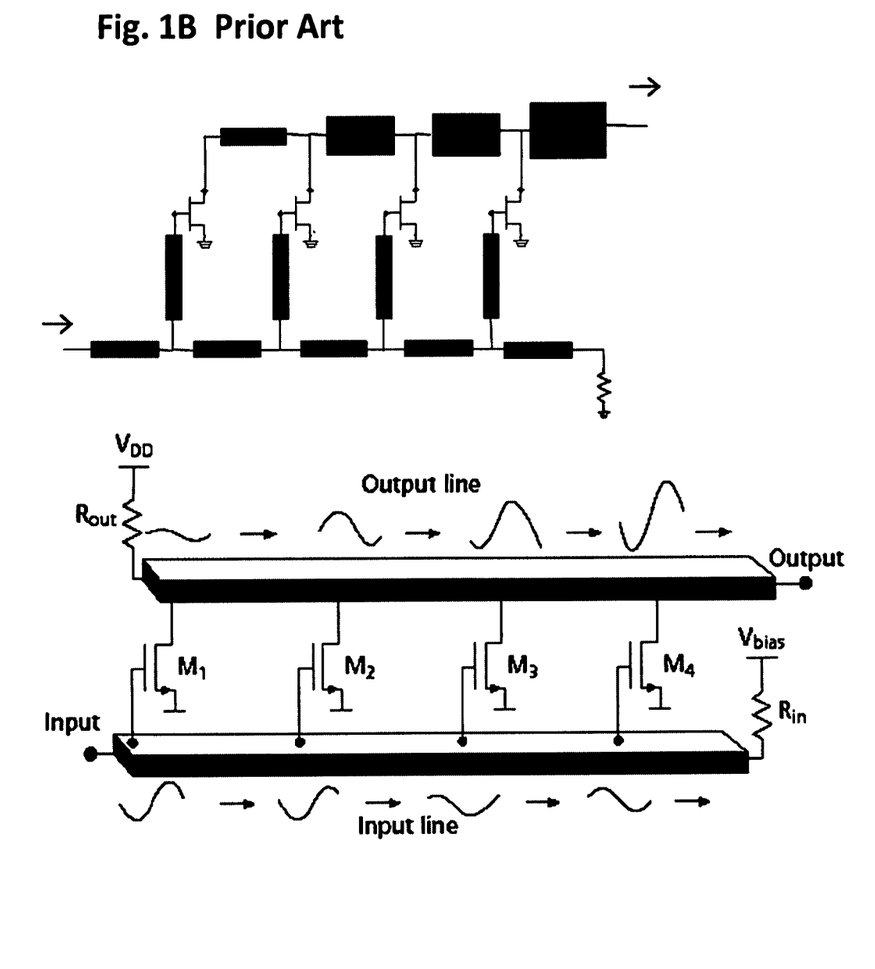
FIG. 1B is illustration of a prior art using distributed lossy transmission line concept where the voltage at each device are not uniform over the band.
Figure 2:
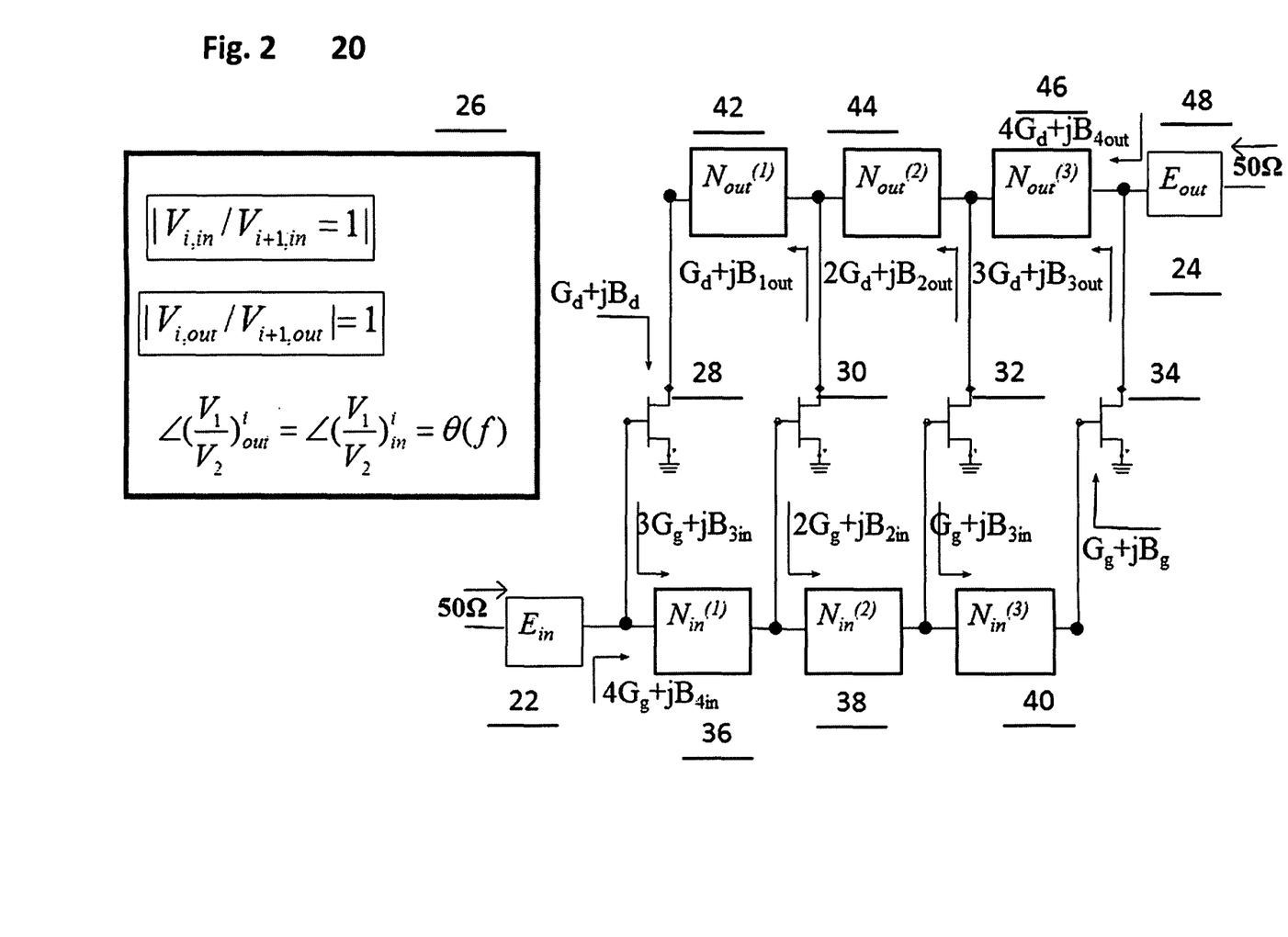
FIG. 2 is a simplified schematic diagrams showing one example of 4-device power combining amplifier and the detailed design goals to achieve 100% power combining efficiency that is specified in FIG. 1.
Figure 3:
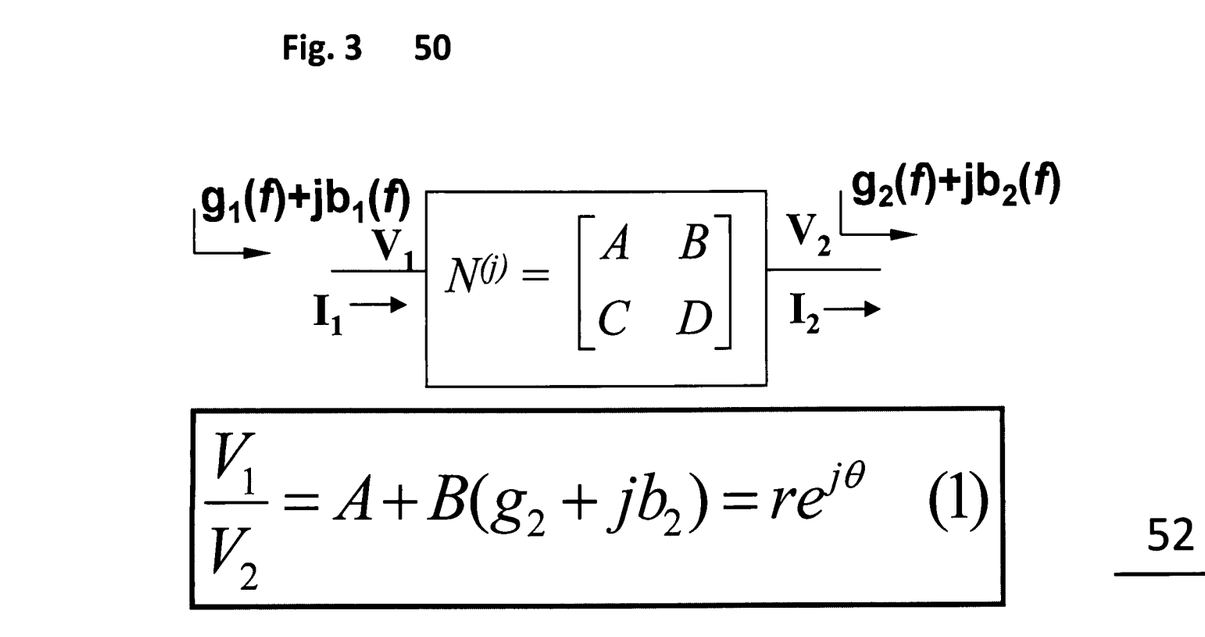
FIG. 3 is the illustration of a voltage transfer function used in the circuit synthesizing process, which expresses the voltage relation at the input and output of the network via its loading admittance g+jb and A B elements of the transfer matrix.
Figure 4:
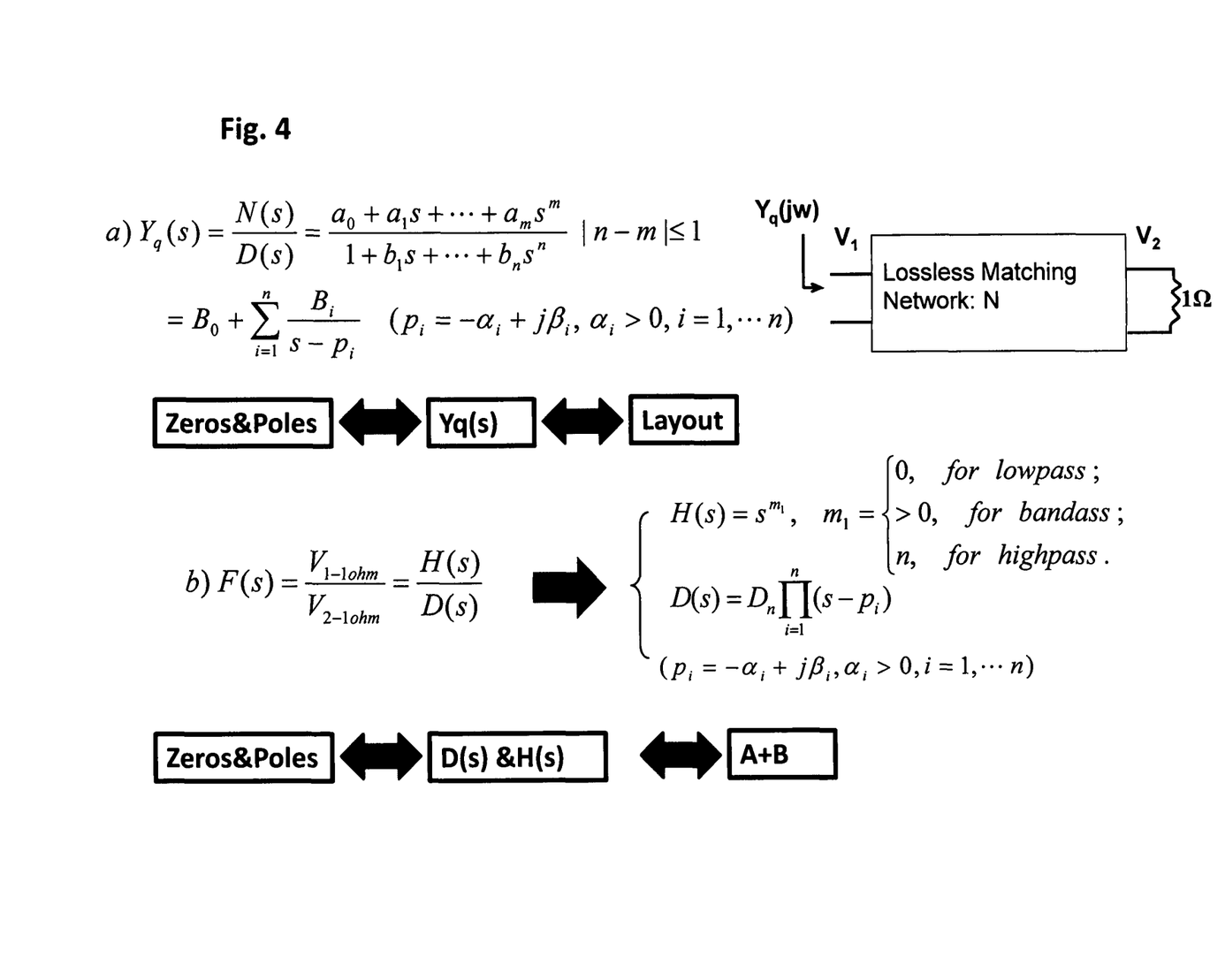
FIG. 4 is a simplified relation chart of a particular network layout, its Y function (the input admittance function when the other end loaded with unit ohm resistor), and zeros and poles of the network N; Equations in FIG. 4 also state the definitions of the $Y_q(s)$ function and F(s) function of the network, as well as their relation flow with their nominator and denominator polynomial functions.
Figure 5:
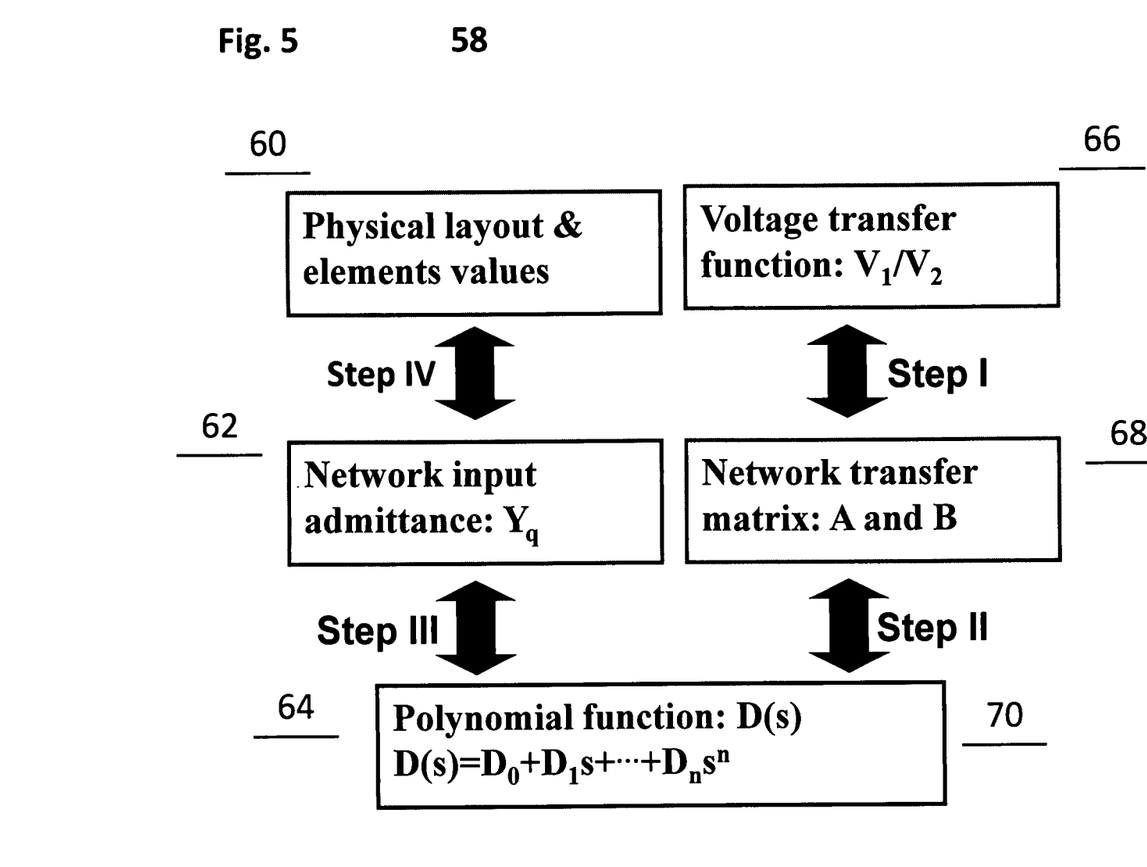
FIG. 5 is a simplified flowchart showing the steps followed in converting the desired voltage relation to polynomial function D(s) of the denominator, then constructing the physical circuits based on the chosen D(s) function with specified voltage goals.
Figure 6:
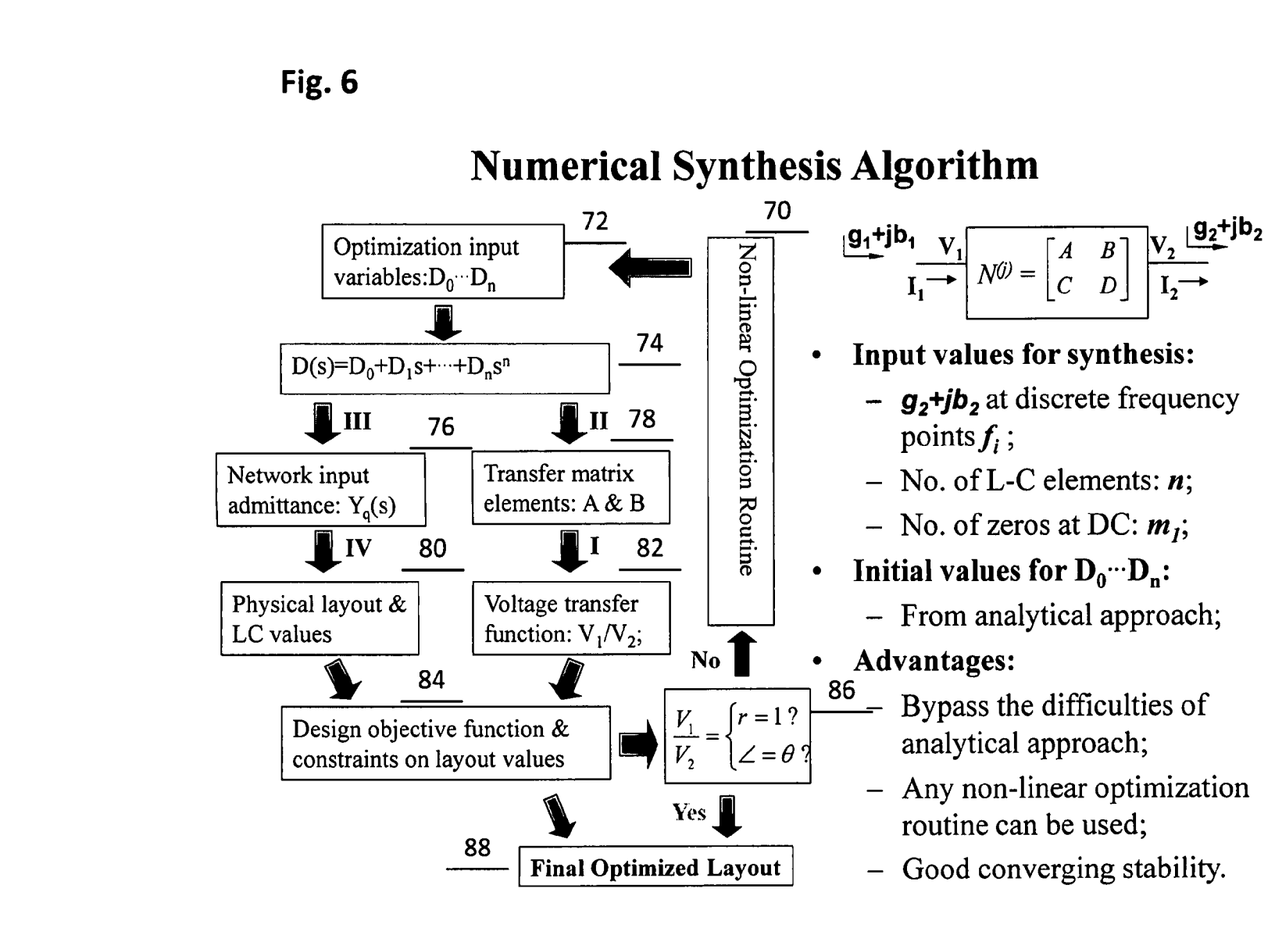
FIG. 6 is the full flowchart illustrating the proposed numerical synthesis method where the design goal of $V_1/V2$ at uniform magnitude and certain pre-specified phase relation is used as design criteria for the final optimized layout.

There is shown in FIG. 1 simplified block diagram 10 showing the general purpose multi-chip power dividing and combining amplifier 10 with equations 13 specified the performance criteria for power combining efficiency, which is one of key performance factors evaluating the effectiveness of the combining circuits. The power dividing 14 and combining 15 blocks will be designed with proposed circuit synthesis method. Based on same architecture, power combining amplifier 20 in FIG. 2 is composed of input matching network 22 and output matching network 24, which can be designed using regular impedance matching theory. The interconnection networks $N^{(i)}_{in}$ 36, 38, 40 and $N^{(i)}_{out}$ 42, 44, and 46 will be designed using proposed power combining method based on the design goals specified in 26. Once the design goals are specified in terms of voltage transfer function of V1/V2 as in 66 in FIG. 5, the physical layout 60 can be obtained by following step I, step II, step III, and step IV in 58. By integrated with design goals 86 in FIG. 6 and proper optimization routine 70, the entire circuit synthesis flow can be easily constructed. As commented in FIG. 6, the input of this method is the complex impedance of the active device g+jb at each design frequency, the number of circuit elements desired to use, the type of the circuit controlled by the zeros of the network $N^{(i)}$ and initial values for coefficients of D function.

In contrast to a conventional circuit synthesis approach, this approach bypasses the difficulties of analytical approach, can be employed with any non-linear optimization tools commercially available and has very good converging stability.

Figure 7:
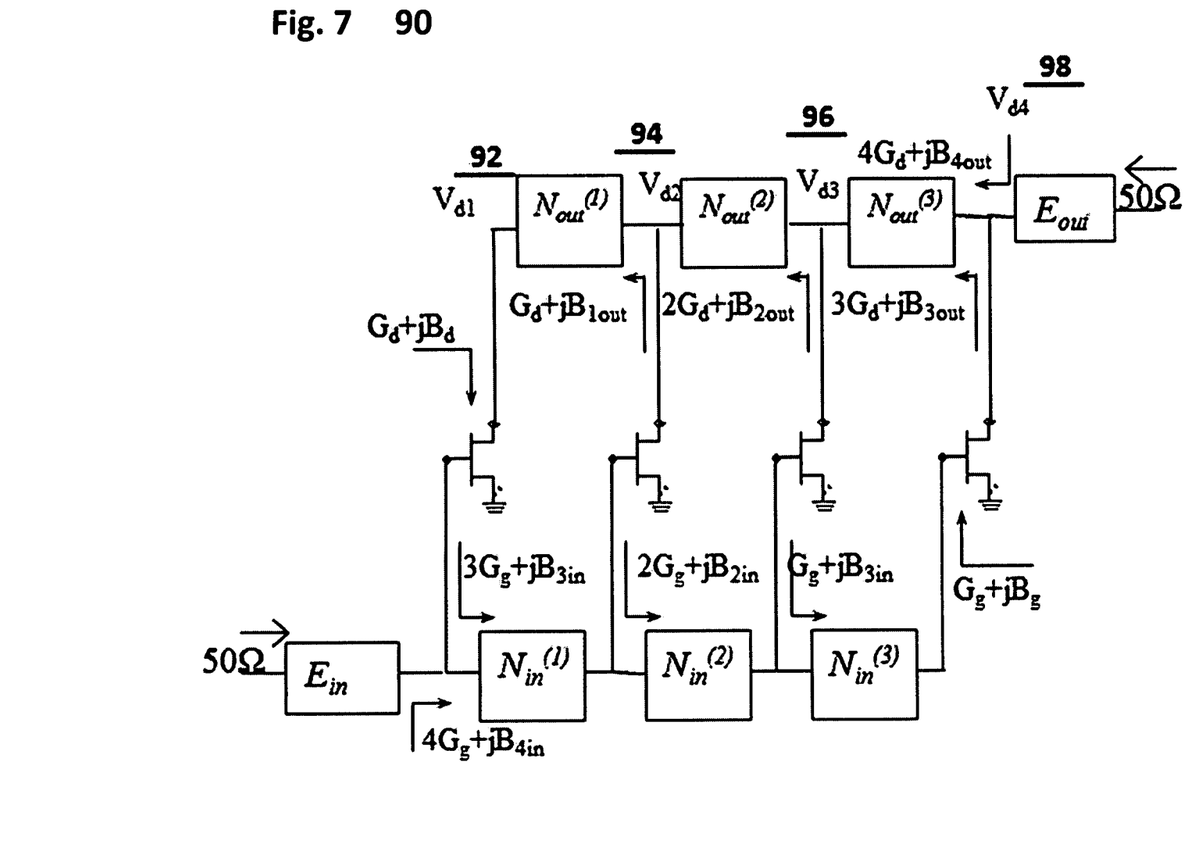
FIG. 7 is the schematic diagram of the 4-device power combining amplifier designed based on proposed synthesis method.
Figure 8:
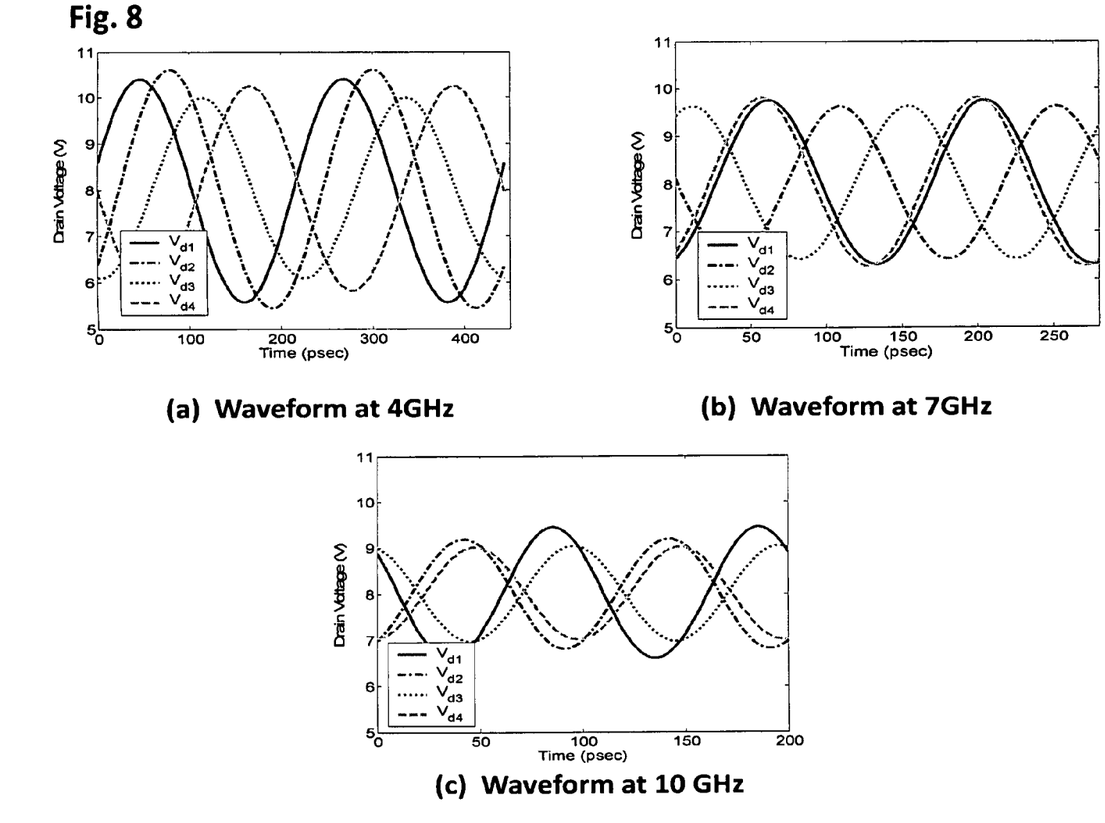
FIG. 8 is the waveform at the drains of the 4 transistor of FIG. 7, where the uniform voltage waveform confirms the success of proposed synthesis method.
Figure 9:
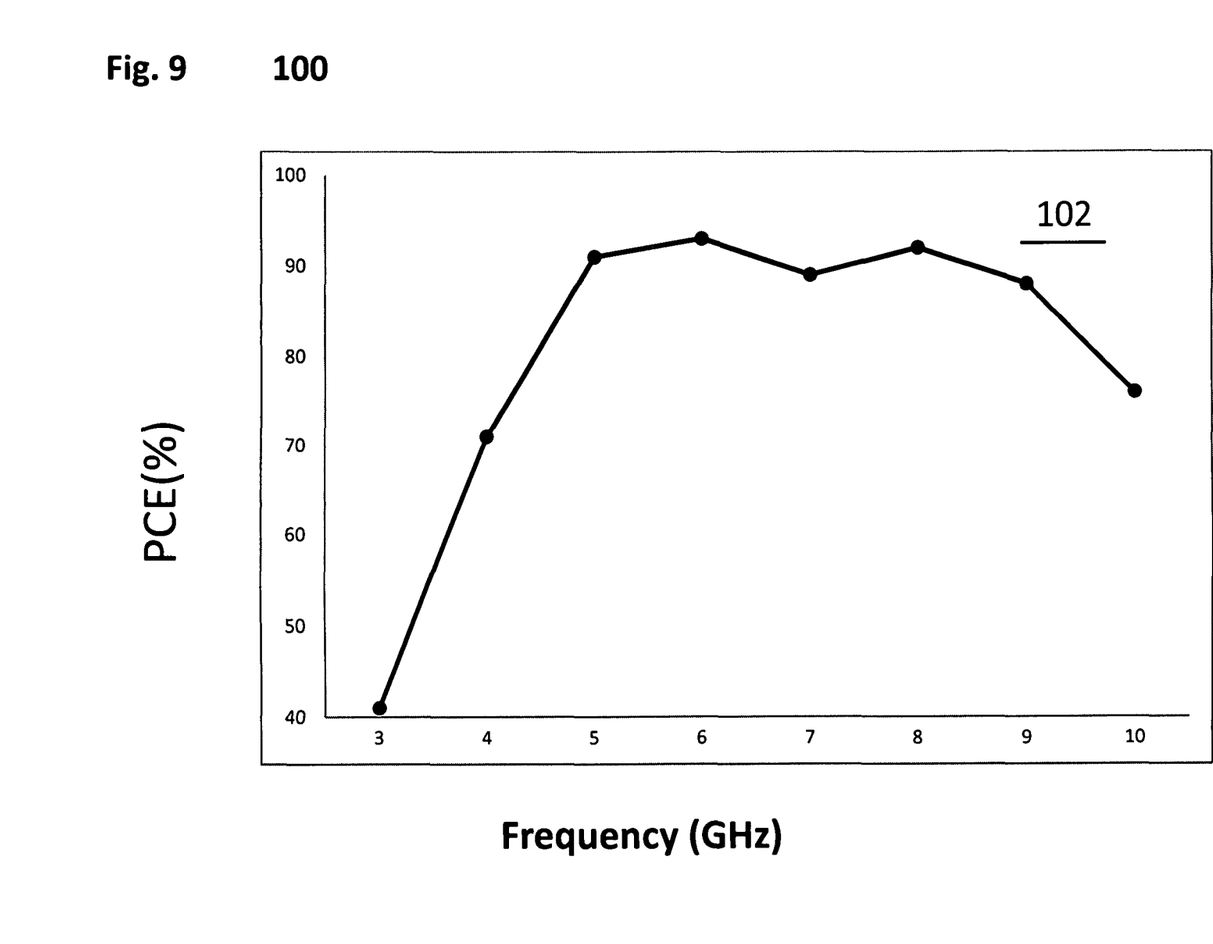
FIG. 9 is measured power combining efficiency of the 4-device power combining amplifier in FIG. 7, which is designed based on proposed synthesis method.

FIG. 7 shows the detailed schematic of one example of 4-device power combining amplifier design based on invention. Drain voltages of this amplifier 92, 94, 96, and 98 are uniform distributed because of the proposed circuit synthesis method. As shown in FIG. 8, the voltage swing of above four device are uniform at 4 GHz, 7 GHz and 10 GHz, which corresponds to close to 100% power combining efficiency. FIG. 9 shows the measured power combining efficiency 102 of FIG. 7 is close to 90% over the specified frequency 4 to 10 GHz.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

The invention claimed is:

1. A power combining method for broadband voltage and current response function comprising:
   a first step of converting desired voltage or current relation over a specified frequency band to specified polynomial transfer equation;
   a second step of formulating the said specified polynomial transfer equation and extracting the coefficients of the denominator polynomial functions;
   a third step of translating the said coefficients of the denominator polynomial functions into the input admittance function of a corresponding network that is terminated with one unit ohm resistor;
   a fourth step of converting the said input admittance function to the corresponding physical network layout with element values,
   a final step of comparing the said voltage/current transfer function in first step with the design goal to decide if the design criteria is met. If not, further optimization step would be used to adjust the said coefficients of the denominator polynomial functions.

2. The power combining method of claim 1 in which said first step the transfer function can be for voltage transfer function and current function as well, where the ABCD matrix are used to express the relation, which is converted into fractional polynomial function with frequency as the independent variables.

3. The power combining method of claim 1 in which said third and fourth steps the input admittance function of a corresponding network that is terminated with one unit ohm resistor is input impedance function of the corresponding network that is terminated with one unit ohm resistor when the said transfer function in first step claim 1 is current transfer function.

4. The power combining method of claim 1 further including a nonlinear optimization routine to search for the optimized solution to generate the circuits composed of standard lumped elements layout with the desired voltage or current transfer relations.

5. A multiple-device power amplifier comprising:
   a first impedance matching network at the input port;
   a second impedance matching network at the output port;
   a set of multiple interconnecting networks at the input of the transistor to provide equal voltage or current driving the active devices, where the said interconnecting networks are generated used the power combining method in claim 1 for given desired operating frequency;
   said a set of multiple interconnecting networks at the output of the transistor to combine equally voltage or current from the drains of the active devices, where the said interconnecting networks are generated used the power combining method in claim 1 for given desired operating frequency;
   said input and output sets of multiple interconnecting networks at the input and output of said amplifier are generated by the power combining method in claim 1 and realized in forms of either lumped elements including capacitors, inductors and transformers, or distributed elements including transmission lines and other standard distributed passive elements.

* * * * *